(12) United States Patent
Gaade et al.

(10) Patent No.: US 12,712,494 B2
(45) Date of Patent: Aug. 18, 2026

(54) CONCURRENT MATCHING TRANSCEIVER FOR POWER AMPLIFIER

(71) Applicant: QUALCOMM Incorporated, San Diego, CA (US)

(72) Inventors: Dayasagar Gaade, Irvine, CA (US); Hai Huang, San Jose, CA (US); Wen Li, Mountain View, CA (US)

(73) Assignee: Qualcomm Incorporated, San Diego, CA (US)

( * ) Notice: Subject to any disclaimer, the term of this patent is extended or adjusted under 35 U.S.C. 154(b) by 276 days.

(21) Appl. No.: 18/665,218

(22) Filed: May 15, 2024

(65) Prior Publication Data

US 2025/0357896 A1 Nov. 20, 2025

(51) Int. Cl.
*H03F 1/02* (2006.01)
*H03F 3/24* (2006.01)

(52) U.S. Cl.
CPC ........... *H03F 1/0288* (2013.01); *H03F 3/245* (2013.01); *H03F 2200/294* (2013.01); *H03F 2200/451* (2013.01)

(58) Field of Classification Search
CPC .. H03F 1/0288; H03F 3/245; H03F 2200/294; H03F 2200/451
USPC .......................................................... 455/73
See application file for complete search history.

(56) References Cited

U.S. PATENT DOCUMENTS 3,781,716 A * 12/1973 Gerst .................. H04L 27/2035 332/105
7,526,256 B2 * 4/2009 Bhatti .................... H04B 1/006 455/73
9,503,160 B1 * 11/2016 Hyde ...................... H03F 3/193
9,819,323 B2 * 11/2017 Aboush ................ H03H 7/0138
9,941,843 B2 * 4/2018 Nobbe ...................... H03F 1/56
10,374,554 B2 * 8/2019 Karmaker ............. H03F 1/0205
10,419,045 B1 * 9/2019 Snai ......................... H04B 1/18
10,581,385 B2 * 3/2020 Snai ........................ H03F 3/193
10,594,279 B2 * 3/2020 Dandu ................... H01Q 21/08
10,727,790 B2 * 7/2020 Balteanu ................. H03F 3/193
10,985,709 B2 * 4/2021 Kuo ........................ H03F 1/565
11,533,075 B1 * 12/2022 Yu ............................ H03F 3/72
11,641,155 B2 * 5/2023 Ayati ...................... H04L 27/20 307/105
11,671,061 B2 * 6/2023 Gebeyehu ................ H03F 1/56 330/276
12,191,896 B2 * 1/2025 Liu ....................... H03M 1/002
2006/0091958 A1 * 5/2006 Bhatti ................ H03F 3/45188 330/295

(Continued)

OTHER PUBLICATIONS

Co-pending U.S. Appl. No. 18/339,714, inventor De Falco; Paolo Enrico, filed on Jun. 22, 2023.

(Continued)

*Primary Examiner* — April G Gonzales
(74) *Attorney, Agent, or Firm* — Gerald P. Joyce, III

(57) ABSTRACT

Certain aspects of the present disclosure are directed towards techniques and apparatus for implementing concurrent matching for a transmitter and a receiver. An example transceiver may include a first amplifier, a second amplifier, a third amplifier, a first transformer, a second transformer, a first switch, and a third transformer. The first switch is coupled between a terminal of a secondary winding of the first transformer and a reference potential node.

20 Claims, 8 Drawing Sheets

(56) References Cited

U.S. PATENT DOCUMENTS

2009/0108937 A1* 4/2009 Yamaguchi ............... H03F 1/26 330/260
2011/0096574 A1* 4/2011 Huang .............. H02M 3/33507 363/21.18
2012/0299659 A1* 11/2012 Sankalp .............. H03F 3/45183 330/296
2013/0265132 A1* 10/2013 Huang .................... H01F 27/29 336/200
2014/0077919 A1* 3/2014 Godoy .................... H01F 30/08 336/226
2016/0358705 A1* 12/2016 Lin ......................... H02M 1/40
2016/0359419 A1* 12/2016 Lin ................... H02M 3/33592
2016/0359421 A1* 12/2016 Lin ......................... H02M 1/08
2018/0198428 A1* 7/2018 Hanafi .................... H03F 3/245
2018/0226924 A1* 8/2018 Ngai ..................... H03F 1/0205
2018/0248571 A1* 8/2018 Wang ....................... H04B 1/04
2019/0199290 A1* 6/2019 Karmaker ............. H03F 1/0205
2020/0036345 A1* 1/2020 Snai ......................... H04B 1/16
2021/0257726 A1* 8/2021 Lyn .......................... H01Q 1/50
2021/0336526 A1* 10/2021 Ayati .................... H03F 3/2173
2022/0006429 A1* 1/2022 Bao ......................... H03F 3/195
2022/0123698 A1* 4/2022 Goto ..................... H03F 3/4508
2023/0074461 A1* 3/2023 Liu ....................... H03M 1/806
2023/0091253 A1* 3/2023 Wang .................... H03F 1/0288 330/124 R
2023/0098175 A1* 3/2023 Weberg .................... H04B 1/04 455/552.1
2023/0238797 A1* 7/2023 Langguth ............... H02H 9/041 361/111
2023/0253937 A1* 8/2023 Tanaka ...................... H03F 3/68 455/73
2023/0299679 A1* 9/2023 Li ....................... H02M 1/4258
2023/0361728 A1* 11/2023 Miehle .................... H03F 3/195
2024/0014846 A1* 1/2024 Din .......................... H04B 1/48
2024/0056041 A1* 2/2024 Lehtola ................. H03F 1/0288
2024/0097628 A1* 3/2024 Singhal ................... H03F 3/245
2025/0175133 A1* 5/2025 Ali ...................... H01F 27/2804
2025/0240039 A1* 7/2025 Park ......................... H04B 1/18
2025/0240041 A1* 7/2025 Jung ....................... H03F 3/245
2025/0337375 A1* 10/2025 Seebacher ............... H03F 3/245

OTHER PUBLICATIONS

International Search Report and Written Opinion—PCT/US2025/026777—ISA/EPO—Jul. 18, 2025.

Ahmed A., et al., "Gate Bias Modulation for Doherty Power Amplifier", Proceedings of the 48th European Microwave Conference (EuMC), Sep. 23-27, 2018, pp. 531-534, DOI: 10.23919/EuMC.2018.8541738.

Ryu N., et al., "CMOS Doherty Amplifier With Variable Balun Transformer and Adaptive Bias Control for Wireless LAN Application", IEEE Journal of Solid-State Circuits, Jun. 2014, vol. 49, No. 6, pp. 1356-1365, DOI: 10.1109/JSSC.2014.2313561.

* cited by examiner

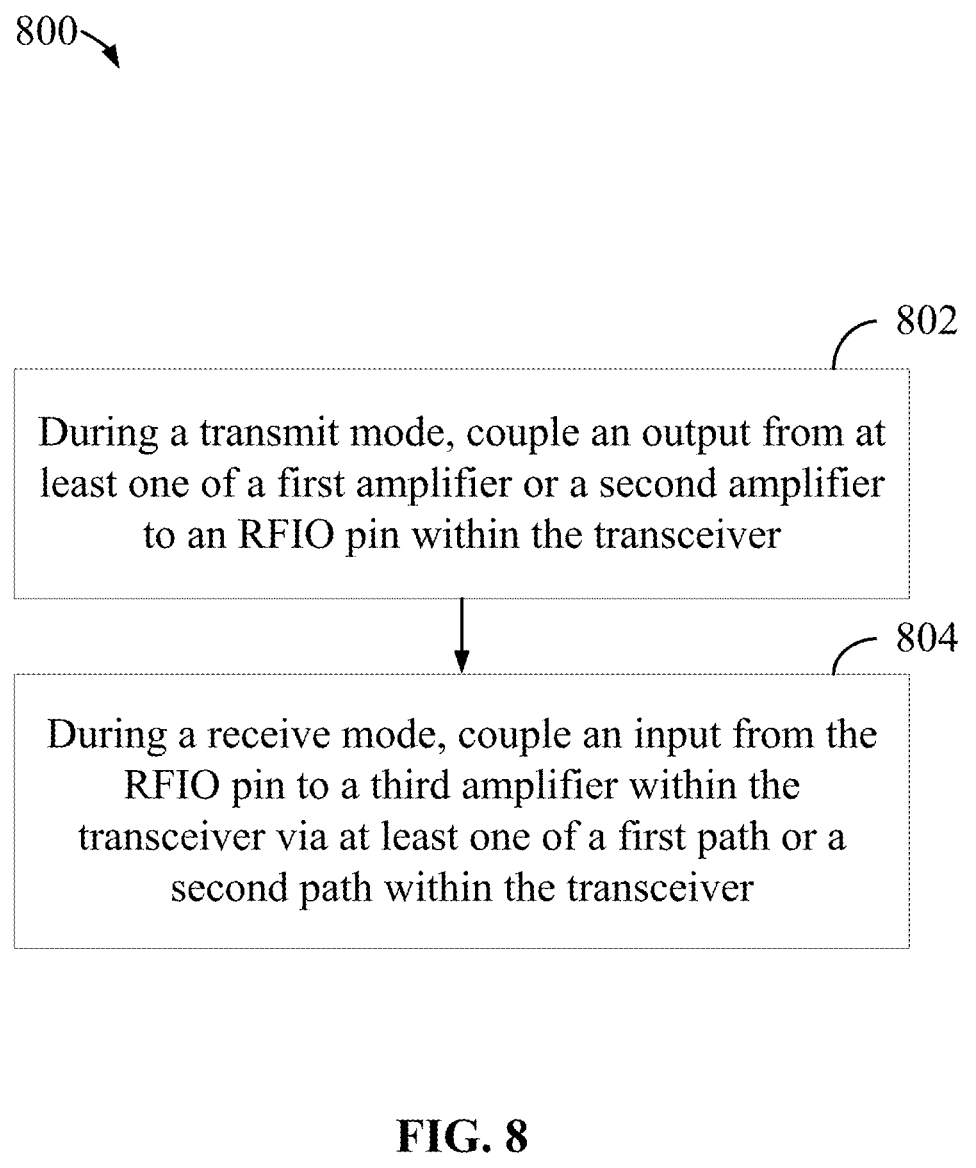

800

802

During a transmit mode, couple an output from at least one of a first amplifier or a second amplifier to an RFIO pin within the transceiver

804

During a receive mode, couple an input from the RFIO pin to a third amplifier within the transceiver via at least one of a first path or a second path within the transceiver

FIG. 8

CONCURRENT MATCHING TRANSCEIVER FOR POWER AMPLIFIER

TECHNICAL FIELD

Certain aspects of the present disclosure generally relate to electronic circuits and, more particularly, to techniques for signal reception and transmission implemented with concurrent matching.

BACKGROUND

Wireless communication devices are widely deployed to provide various communication services such as telephony, video, data, messaging, broadcasts, and so on. Such wireless communication devices may transmit and/or receive radio frequency (RF) signals via any of various suitable radio access technologies (RATs) including, but not limited to, Fifth Generation (5G) New Radio (NR), Long Term Evolution (LTE), Code Division Multiple Access (CDMA), Time Division Multiple Access (TDMA), Wideband CDMA (WCDMA), Global System for Mobility (GSM), Bluetooth, Bluetooth Low Energy (BLE), Zigbee, wireless local area network (WLAN) RATs (e.g., WiFi), and the like.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include one or more transmitters and receivers.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include reduced transceiver noise.

Certain aspects of the present disclosure can be implemented in a transceiver. The transceiver generally includes: a first amplifier; a second amplifier; a third amplifier; a first transformer including: a first input and a second input coupled to a first output and a second output of the first amplifier; a primary winding coupled between the first input and the second input of the first transformer; and a secondary winding inductively coupled to the primary winding of the first transformer; a second transformer including: a first input and a second input coupled to a first output and a second output of the second amplifier; a primary winding coupled between the first input and the second input of the second transformer; and a secondary winding inductively coupled to the primary winding and coupled between a first terminal of the secondary winding of the first transformer and a reference potential node; a first switch coupled between the first terminal of the secondary winding of the first transformer and the reference potential node; and a third transformer including a primary winding coupled between a second terminal of the secondary winding of the first transformer and a first input of the third amplifier.

Certain aspects of the present disclosure can be implemented in a wireless device. The wireless device generally includes an antenna and a transceiver coupled to the antenna. The transceiver includes: a first amplifier; a second amplifier; a third amplifier; a first transformer including: a first input and a second input coupled to a first output and a second output of the first amplifier; a primary winding coupled between the first input and the second input of the first transformer; and a secondary winding inductively coupled to the primary winding of the first transformer; a second transformer including: a first input and a second input coupled to a first output and a second output of the second amplifier; a primary winding coupled between the first input and the second input of the second transformer; and a secondary winding inductively coupled to the primary winding and coupled between a first terminal of the secondary winding of the first transformer and a reference potential node; a first switch coupled between the first terminal of the secondary winding of the first transformer and the reference potential node; and a third transformer including a primary winding coupled between a second terminal of the secondary winding of the first transformer and a first input of the third amplifier.

Certain aspects of the present disclosure can be implemented in a method for wireless communication. The method generally includes, during a transmit mode, coupling an output from at least one of a first amplifier or a second amplifier to a radio frequency (RF) input/output (I/O) (RFIO) pin within a transceiver. The method also includes, during a receive mode, coupling an input from the RFIO pin to a third amplifier within the transceiver via at least one of a first path or a second path within the transceiver. The transceiver includes: the first amplifier; the second amplifier; the third amplifier; a first transformer including: a first input and a second input coupled to a first output and a second output of the first amplifier; a primary winding coupled between the first input and the second input of the first transformer; and a secondary winding inductively coupled to the primary winding of the first transformer; a second transformer including: a first input and a second input coupled to a first output and a second output of the second amplifier; a primary winding coupled between the first input and the second input of the second transformer; and a secondary winding inductively coupled to the primary winding and coupled between a first terminal of the secondary winding of the first transformer and a reference potential node; a first switch coupled between the first terminal of the secondary winding of the first transformer and the reference potential node; and a third transformer including a primary winding coupled between a second terminal of the secondary winding of the first transformer and a first input of the third amplifier.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIG. 8 is a flow diagram illustrating example operations for wireless communication, in accordance with certain aspects of the present disclosure.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
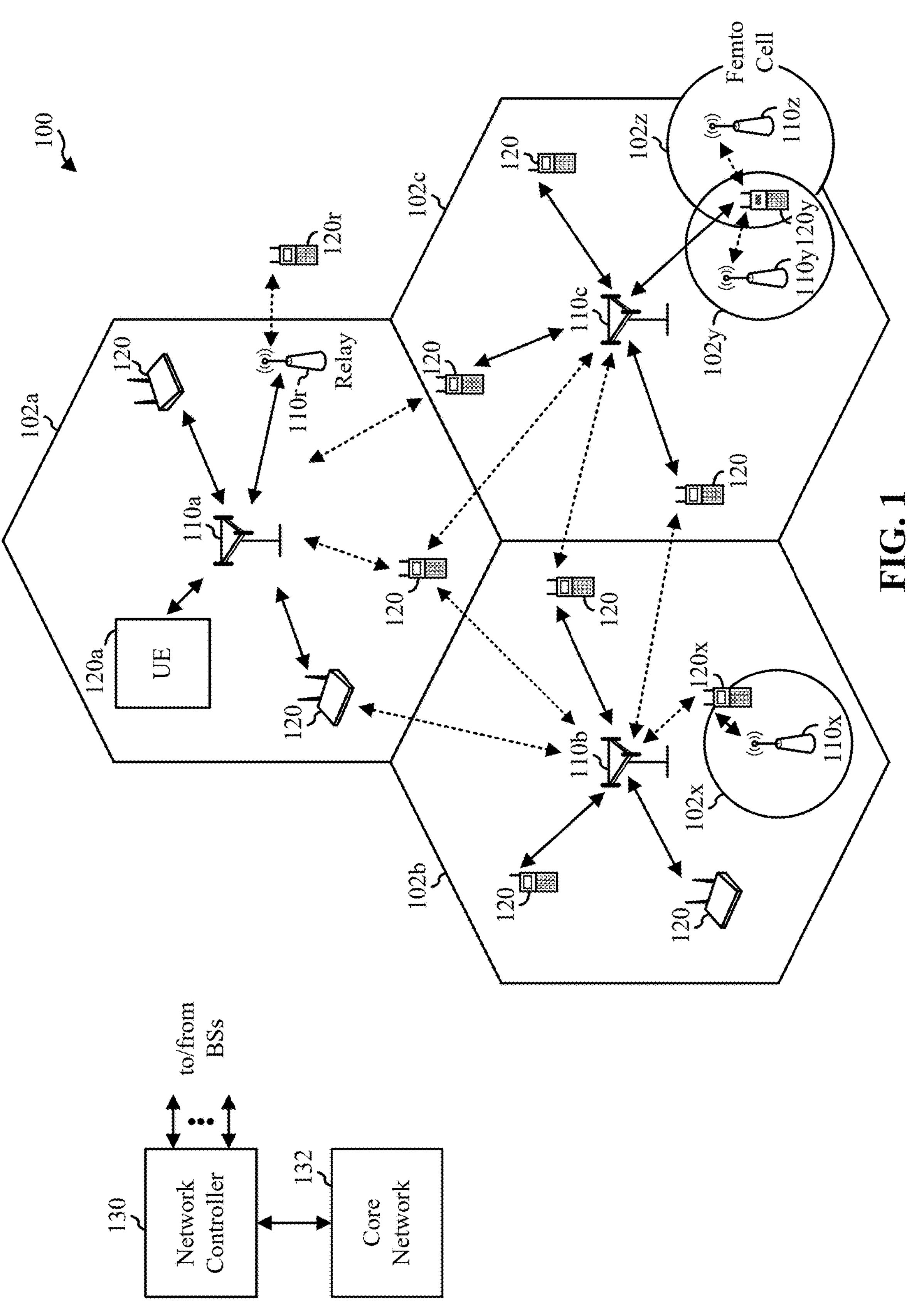
FIG. 1 is a diagram of an example wireless communications network, in which aspects of the present disclosure may be practiced.

Certain aspects of the present disclosure are directed towards techniques and apparatus for implementing concurrent matching for a transceiver (e.g., transmitter and receiver). In certain radio frequency (RF) systems (e.g., time division duplexing (TDD) systems), the transceiver may include one or more internal (or integrated) transmit-receive (TR) switches that control an operation mode (e.g., transmit mode or receive mode) of the transceiver. For example, in receive mode, the TR switch(es) may be used to couple an antenna to the receiver, and in transmit mode, the TR switch(es) may be used to couple the antenna to the transmitter.

Internal TR switch-based transceivers may perform concurrent matching in both the transmit mode and receive mode of the transceiver. However, one potential challenge to implementing such concurrent matching is that, in the receive mode, the concurrent matching may introduce a loss in one or more passive devices (e.g., transformer) which can reduce the receive sensitivity. The internal TR switches introduce loss and reduce efficiency of the transmit mode (e.g., reduced power amplifier (PA) transmit efficiency and output power). Another challenge is to design an optimal concurrent match which works best for both receive and transmit modes.

Additionally, certain transceivers may be implemented with a Doherty amplifier, such as a series Doherty amplifier. However, existing concurrent matches with a series Doherty amplifier can result in a greater loss in the one or more passive devices, as well as introduce a noise figure (NF) peak close to the in-band frequency of the receive mode, thereby degrading the receiver (Rx) NF (RxNF).

As such, certain aspects described herein provide techniques and apparatus for implementing concurrent matching for a transceiver implemented with one or more internal TR switches and a series Doherty PA. A portion of the transceiver may be implemented, for example, with a series Doherty amplifier (with a main amplifier and an auxiliary amplifier), a main transformer (e.g., main balun) for the main amplifier, an auxiliary transformer (e.g., auxiliary balun) for the auxiliary amplifier, and one or more internal TR switches. As described in greater detail below, the internal TR switch(es) may be arranged within the transceiver in a manner that reduces the loss from the main and auxiliary transformers, thereby improving the efficiency of the transmit mode (e.g., increased PA transmit efficiency and output power).

Additionally, in certain aspects described in more detail herein, the transceiver may also include another (third) transformer, where the primary winding of the (third) transformer is coupled to the secondary winding of the main transformer. In such aspects, the primary winding of the (third) transformer and the secondary winding of the main transformer may form (or compose) a step-up transformer with voltage gain prior to the loss from the (third) transformer, thereby improving the RxNF and the Rx front-end (FE) (RxFE) gain.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word “exemplary” is used herein to mean “serving as an example, instance, or illustration.” Any aspect described herein as “exemplary” is not necessarily to be construed as preferred or advantageous over other aspects.

As used herein, the term “connected with” in the various tenses of the verb “connect” may mean that element A is directly connected to element B or that other elements may be connected between elements A and B (i.e., that element A is indirectly connected with element B). In the case of electrical components, the term “connected with” may also be used herein to mean that a wire, trace, or other electrically conductive material is used to electrically connect elements A and B (and any components electrically connected therebetween).

An Example Wireless System

FIG. 1 illustrates an example wireless communications network 100, in which aspects of the present disclosure may be practiced. For example, the wireless communications network 100 may be a New Radio (NR) system (e.g., a Fifth Generation (5G) NR network), an Evolved Universal Terrestrial Radio Access (E-UTRA) system (e.g., a Fourth Generation (4G) network), a Universal Mobile Telecommunications System (UMTS) (e.g., a Second Generation/Third Generation (2G/3G) network), or a code division multiple access (CDMA) system (e.g., a 2G/3G network), or may be configured for communications according to an IEEE standard such as one or more of the 802.11 standards, etc.

As illustrated in FIG. 1, the wireless communications network 100 may include a number of base stations (BSs) 110*a-z* (each also individually referred to herein as "BS 110" or collectively as "BSs 110") and other network entities. A BS may also be referred to as an access point (AP), an evolved Node B (eNodeB or eNB), a next generation Node B (gNodeB or gNB), or some other terminology.

A BS 110 may provide communication coverage for a particular geographic area, sometimes referred to as a "cell," which may be stationary or may move according to the location of a mobile BS. In some examples, the BSs 110 may be interconnected to one another and/or to one or more other BSs or network nodes (not shown) in wireless communications network 100 through various types of backhaul interfaces (e.g., a direct physical connection, a wireless connection, a virtual network, or the like) using any suitable transport network. In the example shown in FIG. 1, the BSs 110*a*, 110*b*, and 110*c* may be macro BSs for the macro cells 102*a*, 102*b*, and 102*c*, respectively. The BS 110*x* may be a pico BS for a pico cell 102*x*. The BSs 110*y* and 110*z* may be femto BSs for the femto cells 102*y* and 102*z*, respectively. A BS may support one or multiple cells.

The BSs 110 communicate with one or more user equipments (UEs) 120*a-y* (each also individually referred to herein as "UE 120" or collectively as "UEs 120") in the wireless communications network 100. A UE may be fixed or mobile and may also be referred to as a user terminal (UT), a mobile station (MS), an access terminal, a station (STA), a client, a wireless device, a mobile device, or some other terminology. A user terminal may be a wireless device, such as a cellular phone, a smartphone, a personal digital assistant (PDA), a handheld device, a wearable device, a wireless modem, a laptop computer, a tablet, a personal computer, etc.

The BSs 110 are considered transmitting entities for the downlink and receiving entities for the uplink. The UEs 120 are considered transmitting entities for the uplink and receiving entities for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink. $N_{up}$ UEs may be selected for simultaneous transmission on the uplink, $N_{dn}$ UEs may be selected for simultaneous transmission on the downlink. $N_{up}$ may or may not be equal to $N_{dn}$, and $N_{up}$ and $N_{dn}$ may be static values or can change for each scheduling interval. Beam-steering or some other spatial processing technique may be used at the BSs 110 and/or UEs 120.

The UEs 120 (e.g., 120*x*, 120*y*, etc.) may be dispersed throughout the wireless communications network 100, and each UE 120 may be stationary or mobile. The wireless communications network 100 may also include relay stations (e.g., relay station 110*r*), also referred to as relays or the like, that receive a transmission of data and/or other information from an upstream station (e.g., a BS 110*a* or a UE 120*r*) and send a transmission of the data and/or other information to a downstream station (e.g., a UE 120 or a BS 110), or that relays transmissions between UEs 120, to facilitate communication between devices.

The BSs 110 may communicate with one or more UEs 120 at any given moment on the downlink and uplink. The downlink (i.e., forward link) is the communication link from the BSs 110 to the UEs 120, and the uplink (i.e., reverse link) is the communication link from the UEs 120 to the BSs 110. A UE 120 may also communicate peer-to-peer with another UE 120.

The wireless communications network 100 may use multiple transmit and multiple receive antennas for data transmission on the downlink and uplink. BSs 110 may be equipped with a number $N_{ap}$ of antennas to achieve transmit diversity for downlink transmissions and/or receive diversity for uplink transmissions. A set $N_u$ of UEs 120 may receive downlink transmissions and transmit uplink transmissions. Each UE 120 may transmit user-specific data to and/or receive user-specific data from the BSs 110. In general, each UE 120 may be equipped with one or multiple antennas. The $N_u$ UEs 120 can have the same or different numbers of antennas.

The wireless communications network 100 may be a time division duplex (TDD) system or a frequency division duplex (FDD) system. For a TDD system, the downlink and uplink share the same frequency band. For an FDD system, the downlink and uplink use different frequency bands. The wireless communications network 100 may also utilize a single carrier or multiple carriers for transmission. Each UE 120 may be equipped with a single antenna (e.g., to keep costs down) or multiple antennas (e.g., where the additional cost can be supported).

A network controller 130 (also sometimes referred to as a "system controller") may be in communication with a set of BSs 110 and provide coordination and control for these BSs 110 (e.g., via a backhaul). In certain cases (e.g., in a 5G NR system), the network controller 130 may include a centralized unit (CU) and/or a distributed unit (DU). In certain aspects, the network controller 130 may be in communication with a core network 132 (e.g., a 5G Core Network (5GC)), which provides various network functions such as Access and Mobility Management, Session Management, User Plane Function, Policy Control Function, Authentication Server Function, Unified Data Management, Application Function, Network Exposure Function, Network Repository Function, Network Slice Selection Function, etc.

In certain aspects of the present disclosure, the BSs 110 and/or the UEs 120 may include a transceiver implemented with concurrent matching, as described in more detail herein.

Figure 2:
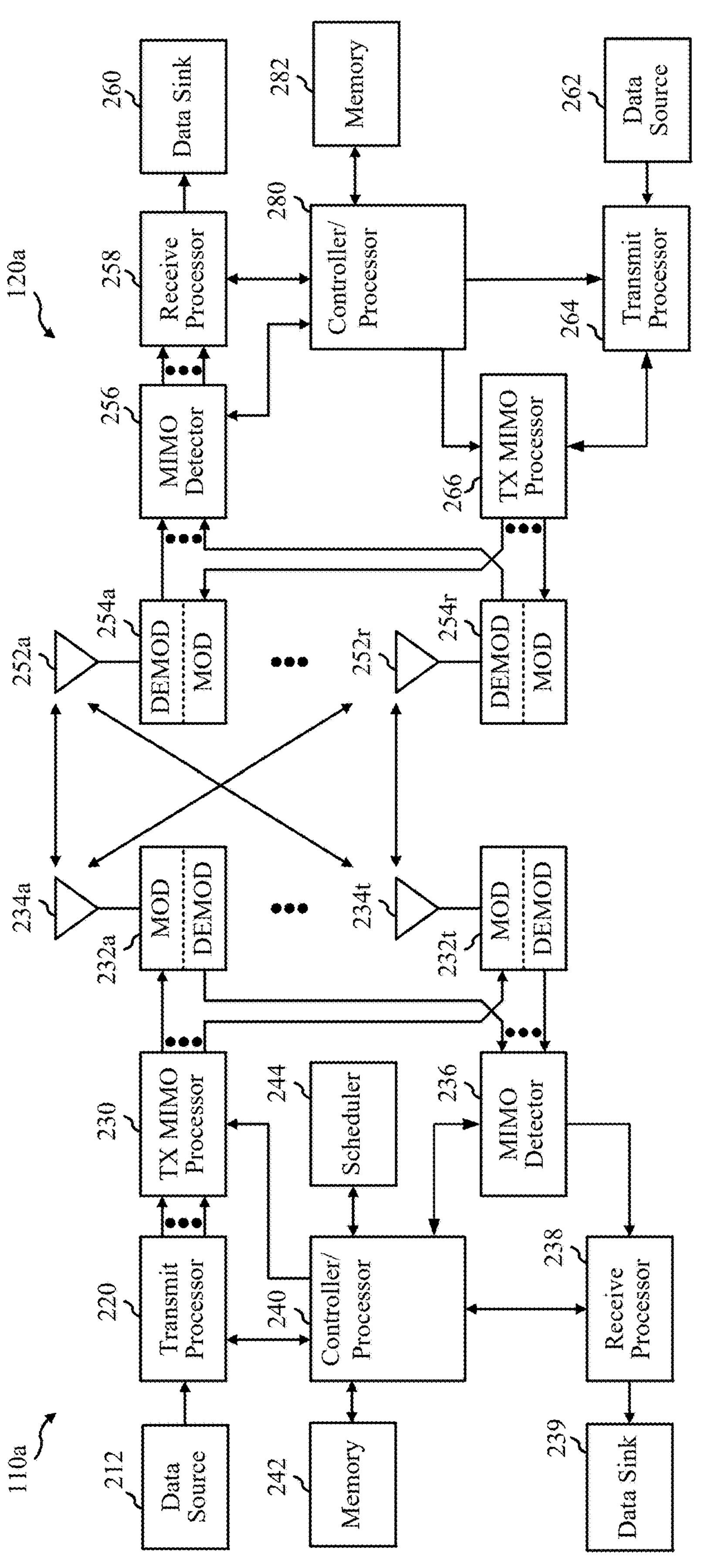
FIG. 2 is a block diagram conceptually illustrating a design of an example base station (BS) and user equipment (UE), in which aspects of the present disclosure may be practiced.

FIG. 2 illustrates example components of BS 110*a* and UE 120*a* (e.g., from the wireless communications network 100 of FIG. 1), in which aspects of the present disclosure may be implemented.

On the downlink, at the BS 110*a*, a transmit processor 220 may receive data from a data source 212, control information from a controller/processor 240, and/or possibly other data (e.g., from a scheduler 244). The various types of data may be sent on different transport channels. For example, the control information may be designated for the physical broadcast channel (PBCH), physical control format indicator channel (PCFICH), physical hybrid automatic repeat request (HARQ) indicator channel (PHICH), physical downlink control channel (PDCCH), group common PDCCH (GC PDCCH), etc. The data may be designated for the physical downlink shared channel (PDSCH), etc. A medium access control (MAC)-control element (MAC-CE) is a MAC layer communication structure that may be used for control command exchange between wireless nodes. The MAC-CE may be carried in a shared channel such as a PDSCH, a physical uplink shared channel (PUSCH), or a physical sidelink shared channel (PSSCH).

The processor 220 may process (e.g., encode and symbol map) the data and control information to obtain data symbols and control symbols, respectively. The transmit processor 220 may also generate reference symbols, such as for the primary synchronization signal (PSS), secondary synchronization signal (SSS), PBCH demodulation reference signal (DMRS), and channel state information reference signal (CSI-RS).

A transmit (TX) multiple-input, multiple-output (MIMO) processor 230 may perform spatial processing (e.g., precoding) on the data symbols, the control symbols, and/or the reference symbols, if applicable, and may provide output symbol streams to the modulators (MODs) in transceivers 232*a*-232*t*. Each modulator in transceivers 232*a*-232*t* may process a respective output symbol stream (e.g., for orthogonal frequency division multiplexing (OFDM), etc.) to obtain an output sample stream. Each of the transceivers 232*a*-232*t* may further process (e.g., convert to analog, amplify, filter, and upconvert) the output sample stream to obtain a downlink signal. Downlink signals from the transceivers 232*a*-232*t* may be transmitted via the antennas 234*a*-234*t*, respectively.

At the UE 120*a*, the antennas 252*a*-252*r* may receive the downlink signals from the BS 110*a* and may provide received signals to the transceivers 254*a*-254*r*, respectively. The transceivers 254*a*-254*r* may condition (e.g., filter, amplify, downconvert, and digitize) a respective received signal to obtain input samples. Each demodulator (DEMOD) in the transceivers 232*a*-232*t* may further process the input samples (e.g., for OFDM, etc.) to obtain received symbols. A MIMO detector 256 may obtain received symbols from all the demodulators in transceivers 254*a*-254*r*, perform MIMO detection on the received symbols if applicable, and provide detected symbols. A receive processor 258 may process (e.g., demodulate, deinterleave, and decode) the detected symbols, provide decoded data for the UE 120*a* to a data sink 260, and provide decoded control information to a controller/processor 280.

On the uplink, at UE 120*a*, a transmit processor 264 may receive and process data (e.g., for the physical uplink shared channel (PUSCH)) from a data source 262 and control information (e.g., for the physical uplink control channel (PUCCH)) from the controller/processor 280. The transmit processor 264 may also generate reference symbols for a reference signal (e.g., the sounding reference signal (SRS)). The symbols from the transmit processor 264 may be precoded by a TX MIMO processor 266 if applicable, further processed by the modulators (MODs) in transceivers 254*a*-254*r* (e.g., for single-carrier frequency division multiplexing (SC-FDM), etc.), and transmitted to the BS 110*a*. At the BS 110*a*, the uplink signals from the UE 120*a* may be received by the antennas 234, processed by the demodulators in transceivers 232*a*-232*t*, detected by a MIMO detector 236 if applicable, and further processed by a receive processor 238 to obtain decoded data and control information sent by the UE 120*a*. The receive processor 238 may provide the decoded data to a data sink 239 and the decoded control information to the controller/processor 240.

The memories 242 and 282 may store data and program codes for BS 110*a* and UE 120*a*, respectively. The memories 242 and 282 may also interface with the controllers/processors 240 and 280, respectively. A scheduler 244 may schedule UEs for data transmission on the downlink and/or uplink.

In certain aspects of the present disclosure, the transceivers 232 and/or the transceivers 254 may be implemented with concurrent matching, as described in more detail herein.

NR may utilize orthogonal frequency division multiplexing (OFDM) with a cyclic prefix (CP) on the uplink and downlink. NR may support half-duplex operation using time division duplexing (TDD). OFDM and single-carrier frequency division multiplexing (SC-FDM) partition the system bandwidth into multiple orthogonal subcarriers, which are also commonly referred to as tones, bins, etc. Each subcarrier may be modulated with data. Modulation symbols may be sent in the frequency domain with OFDM and in the time domain with SC-FDM. The spacing between adjacent subcarriers may be fixed, and the total number of subcarriers may be dependent on the system bandwidth. The system bandwidth may also be partitioned into subbands. For example, a subband may cover multiple resource blocks (RBs).

Example RF Transceiver

Figure 3:
FIG. 3 is a block diagram of an example radio frequency (RF) transceiver, in which aspects of the present disclosure may be practiced.
Figure 3:
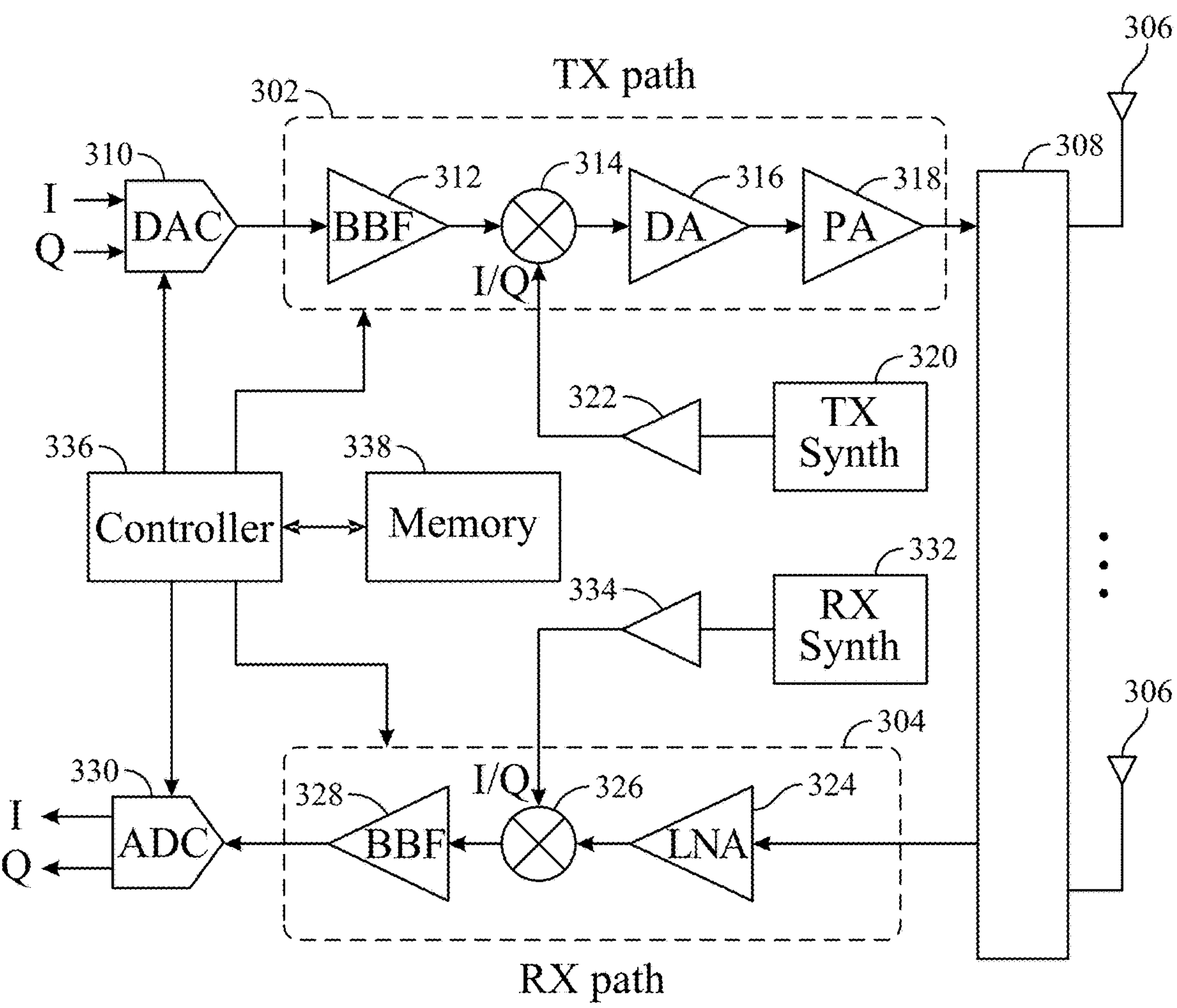

FIG. 3 is a block diagram of an example radio frequency (RF) transceiver circuit 300, in accordance with certain aspects of the present disclosure. The RF transceiver circuit 300 includes at least one transmit (TX) path 302 (also known as a "transmit chain") for transmitting signals via one or more antennas 306 and at least one receive (RX) path 304 (also known as a "receive chain") for receiving signals via the antennas 306. When the TX path 302 and the RX path 304 share an antenna 306, the paths may be connected with the antenna via an interface 308, which may include any of various suitable RF devices, such as a switch, a duplexer, a diplexer, a multiplexer, and the like.

Receiving in-phase (I) and/or quadrature (Q) baseband analog signals from a digital-to-analog converter (DAC) 310, the TX path 302 may include a baseband filter (BBF) 312, a mixer 314, a driver amplifier (DA) 316, and a power amplifier (PA) 318. The BBF 312, the mixer 314, the DA 316, and the PA 318 may be included in a radio frequency integrated circuit (RFIC). For certain aspects, the PA 318 may be external to the RFIC.

The BBF 312 filters the baseband signals received from the DAC 310, and the mixer 314 mixes the filtered baseband signals with a transmit local oscillator (LO) signal to convert the baseband signal of interest to a different frequency (e.g., upconvert from baseband to a radio frequency). This frequency-conversion process produces the sum and difference frequencies between the LO frequency and the frequencies of the baseband signal of interest. The sum and difference frequencies are referred to as the "beat frequencies." The beat frequencies are typically in the RF range, such that the signals output by the mixer 314 are typically RF signals, which may be amplified by the DA 316 and/or by the PA 318 before transmission by the antenna(s) 306. While one mixer 314 is illustrated, several mixers may be used to upconvert the filtered baseband signals to one or more intermediate frequencies and to thereafter upconvert the intermediate frequency (IF) signals to a frequency for transmission.

The RX path 304 may include a low noise amplifier (LNA) 324, a mixer 326, and a baseband filter (BBF) 328. The LNA 324, the mixer 326, and the BBF 328 may be included in one or more RFICs, which may or may not be the same RFIC that includes the TX path components. RF signals received via the antenna(s) 306 may be amplified by the LNA 324, and the mixer 326 mixes the amplified RF signals with a receive local oscillator (LO) signal to convert the RF signal of interest to a different baseband frequency (e.g., downconvert). The baseband signals output by the mixer 326 may be filtered by the BBF 328 before being converted by an analog-to-digital converter (ADC) 330 to digital I and/or Q signals for digital signal processing. In certain aspects, the PA 318 may be implemented as a Doherty amplifier, such as a series Doherty amplifier, with a main amplifier and an auxiliary amplifier. In certain aspects, concurrent matching may be implemented for the PA 318 and LNA 324, as described in more detail herein.

Certain transceivers may employ frequency synthesizers with a variable-frequency oscillator (e.g., a voltage-controlled oscillator (VCO) or a digitally controlled oscillator (DCO)) to generate a stable, tunable LO with a particular tuning range. Thus, the transmit LO may be produced by a TX frequency synthesizer 320, which may be buffered or amplified by amplifier 322 before being mixed with the baseband signals in the mixer 314. Similarly, the receive LO may be produced by an RX frequency synthesizer 332, which may be buffered or amplified by amplifier 334 before being mixed with the RF signals in the mixer 326. For certain aspects, a single frequency synthesizer may be used for both the TX path 302 and the RX path 304. In certain aspects, the TX frequency synthesizer 320 and/or RX frequency synthesizer 332 may include a frequency multiplier, such as a frequency doubler, that is driven by an oscillator (e.g., a VCO) in the frequency synthesizer.

A controller 336 (e.g., controller/processor 280 in FIG. 2) may direct the operation of the RF transceiver circuit 300, such as transmitting signals via the TX path 302 and/or receiving signals via the RX path 304. The controller 336 may be a processor, a digital signal processor (DSP), an application-specific integrated circuit (ASIC), a field-programmable gate array (FPGA) or other programmable logic device (PLD), discrete gate or transistor logic, discrete hardware components, or any combination thereof. A memory 338 (e.g., memory 282 in FIG. 2) may store data and/or program codes for operating the RF transceiver circuit 300. The controller 336 and/or the memory 338 may include control logic (e.g., complementary metal-oxide-semiconductor (CMOS) logic).

While FIGS. 1-3 provide wireless communications as an example application in which certain aspects of the present disclosure may be implemented to facilitate understanding, certain aspects described herein may be used for any of various other suitable systems.

Example Doherty Power Amplifier

In some systems, a power amplifier (e.g., PA 318) may be implemented as a Doherty PA. A Doherty PA generally includes a main amplifier (also referred to as a carrier amplifier) and an auxiliary amplifier (also referred to as a peaking amplifier). The main amplifier may be used for amplifying an input signal, and the auxiliary amplifier may be enabled or otherwise invoked for amplifying high-power components (e.g., the peaks) of the input signal. The Doherty PA can increase the average efficiency of amplification circuitry when amplifying variable envelope signals. For example, the auxiliary amplifier may be used to facilitate amplification of peak power signal components during signal transmission, as described in more detail herein.

Figure 4A:
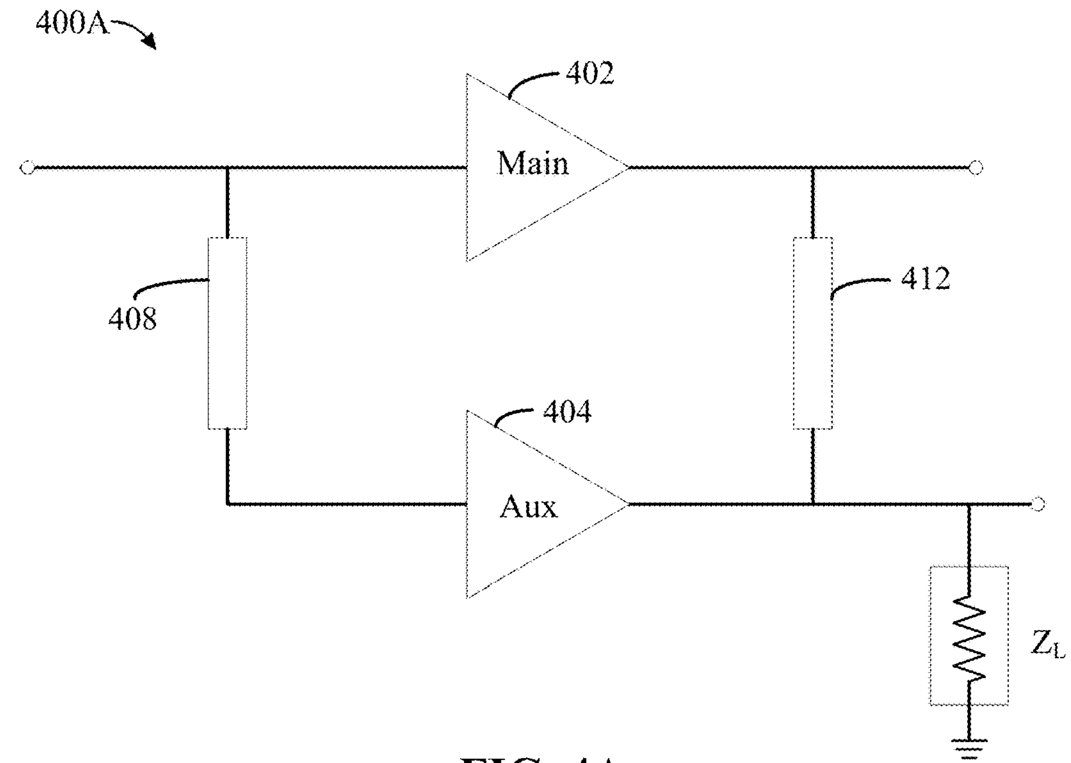
FIG. 4A illustrates an example parallel Doherty power amplifier, in accordance with certain aspects of the present disclosure.
Figure 4B:
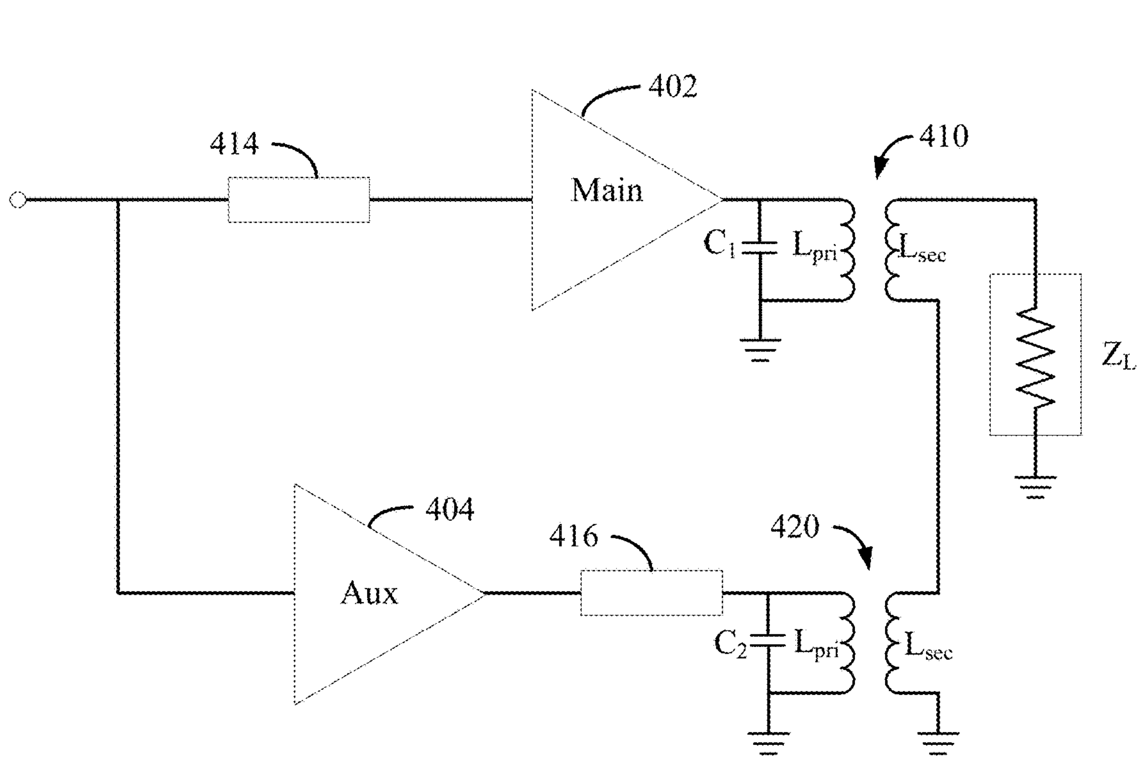
FIG. 4B illustrates an example series Doherty power amplifier, in accordance with certain aspects of the present disclosure.

Doherty PAs may be implemented with various architectures, including, for example, a parallel architecture (referred to herein as a parallel Doherty PA) and a series architecture (referred to herein a series Doherty PA). FIGS. 4A and 4B depict an example architecture 400A of a parallel Doherty PA and an example architecture 400B of a series Doherty PA, respectively, in accordance with certain aspects of the present disclosure.

As shown in FIG. 4A, the architecture 400A includes a main amplifier 402, an auxiliary amplifier 404, a phase compensation element 408, an impedance inverter 412, and a load impedance $Z_L$. The phase compensation element (or phase shifter) 408 is coupled between the inputs of the main amplifier 402 and the auxiliary amplifier 404, and the impedance inverter 412 is coupled between the outputs of the main amplifier 402 and the auxiliary amplifier 404. The impedance inverter 412 generally provides an impedance inversion at the outputs of the main amplifier 402 and auxiliary amplifier 404, and may also introduce a phase shift in the outputs. The phase compensation element 408 is generally used to compensate for the phase shift introduced by the impedance inverter 412. Note, in some cases, the phase compensation element 408 and the impedance inverter 412 may each be implemented as a quarter-wave ($\lambda/4$) transmission line. In other cases, the phase compensation element 408 and the impedance inverter 412 may each be implemented with one or more lumped circuit elements.

As shown in FIG. 4B, the architecture 400B includes the main amplifier 402, the auxiliary amplifier 404, a phase compensation element 414, an impedance inverter 416, a main transformer 410, an auxiliary transformer 420, capacitive elements $C_1$ and $C_2$, and load impedance $Z_L$. A primary inductance ($L_{pri}$) of the main transformer 410 is coupled to the output of the main amplifier 402, and a primary inductance ($L_{pri}$) of the auxiliary transformer 420 is coupled to the output of the auxiliary amplifier 404 via the impedance inverter 416. The main transformer 410 and the auxiliary transformer 420 form a series combining network for the outputs of the main transformer 410 and the auxiliary transformer 420.

In this architecture 400B, the capacitive element $C_1$ resonates in parallel with the primary inductance ($L_{pri}$) of the main transformer 410, and the capacitive element $C_2$ resonates in parallel with the primary inductance ($L_{pri}$) of the auxiliary transformer 420. The impedance inverter 416 provides an impedance inversion at the output of the auxiliary amplifier 404, and may also introduce a phase shift in the output. The phase compensation element 414 coupled to the input of the main amplifier 402 is generally used to compensate for the phase shift introduced by the impedance inverter 416. Note, in some cases, the phase compensation element 414 and the impedance inverter 416 may each be implemented as a quarter-wave ($\lambda/4$) transmission line. In other cases, the phase compensation element 414 and the impedance inverter 416 may each be implemented with one or more lumped circuit elements.

In certain aspects, each of the main amplifier 402 and the auxiliary amplifier 404 in the architecture 400A and/or the architecture 400B may be implemented as two-stage amplifiers. That is, the main amplifier 402 may be implemented with a main driver amplifier and a main power amplifier, and the auxiliary amplifier 404 may be implemented with an auxiliary driver amplifier and an auxiliary power amplifier.

Example Techniques for Concurrent Matching

In certain time division duplexing (TDD) radios, such as WiFi, Bluetooth, Zigbee, and Long-Term Evolution (LTE), the radio frequency (RF) input/output (I/O) (RFIO) pin may be shared between the PA (e.g., PA 318) and the LNA (e.g., LNA 324). This pin sharing may be desirable to reduce the pin count, thereby reducing area consumption, while avoiding usage of an external transmit-receive (TR) switch, which causes loss at the input (e.g., degrading sensitivity) and adds extra cost to the bill of materials (BOM) for a wireless device with one or more TDD radios. Some implementations use a circuit that facilitates using a single RFIO pin and one or more internal TR switches for coupling the receiver and the transmitter to the antenna, reducing the pin count for the transceiver chip.

As noted, internal TR switch-based transceivers may perform concurrent matching in both the transmit mode and receive mode of the transceiver. However, one potential challenge to implementing such concurrent matching is that, in the receive mode, the concurrent matching may introduce a loss in one or more passive devices (e.g., transformer) which can reduce the receive sensitivity. The internal TR switches introduce loss and reduce efficiency of the transmit mode (e.g., reduced power amplifier (PA) transmit efficiency and output power). Another challenge is to design an optimal concurrent match which works best for both receive and transmit modes. Additionally, certain transceivers may be implemented with a Doherty amplifier, such as a series Doherty amplifier. However, existing concurrent matches with a series Doherty amplifier can result in a greater loss in the one or more passive devices, as well as introduce a NF peak close to the in-band frequency of the receive mode, thereby degrading the RxNF. Also choice of the passive components for concurrent matching to get good RxNF may degrade the Transmit performance (e.g. PA efficiency and output power)

Figure 5:
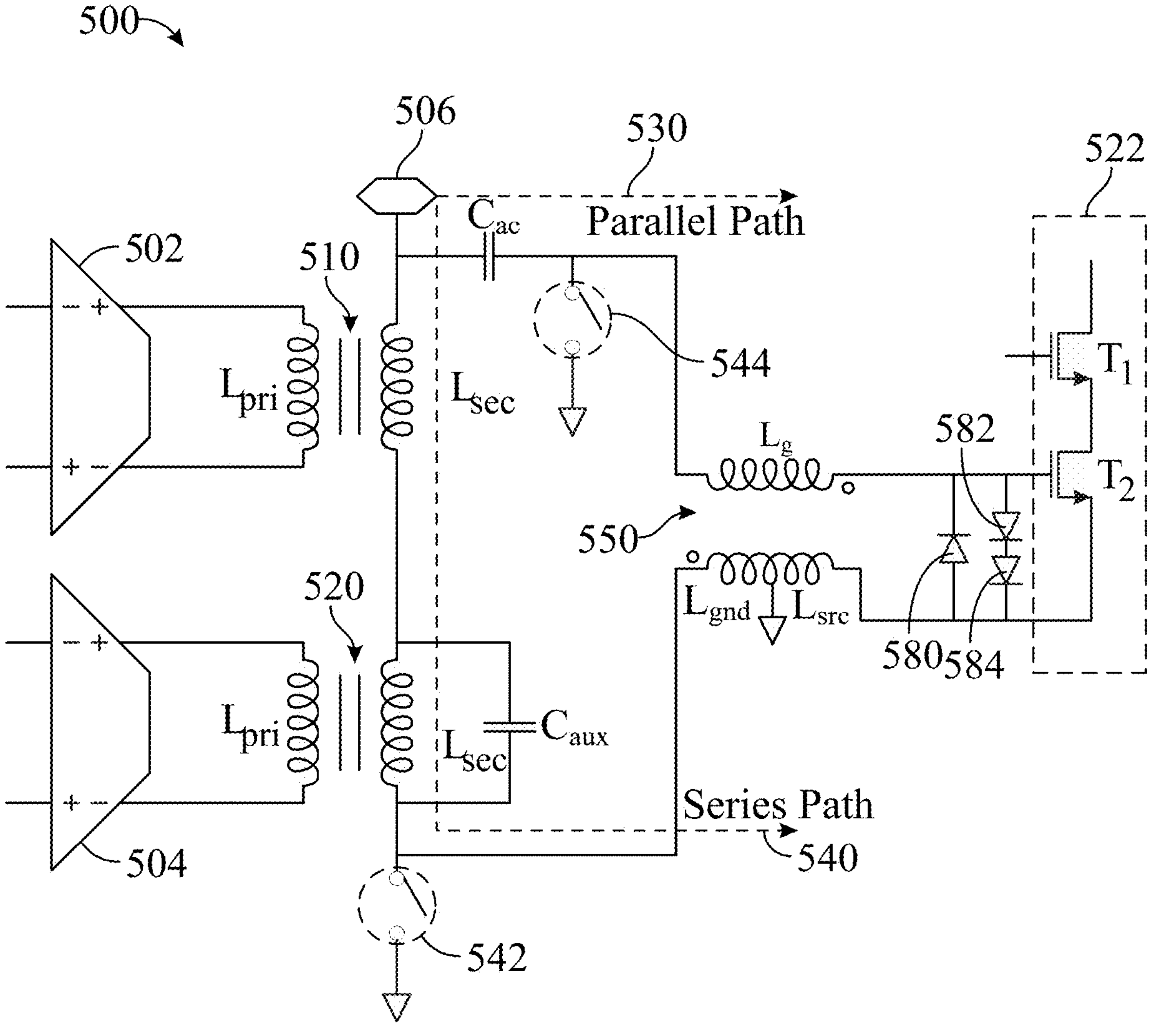
FIGS. 5-7 illustrate different example transceivers implemented with a series Doherty power amplifier and multiple internal transmit-receive switches, in accordance with certain aspects of the present disclosure.

Consider FIG. 5, which depicts an example transceiver 500, in accordance with certain aspects of the present disclosure. The transceiver 500 may represent a portion of a transceiver circuit, such as the RF transceiver circuit 300 of FIG. 3, implemented with a single RFIO pin 506, a series Doherty PA (including amplifier 502 and amplifier 504), and internal TR switches 542 and 544.

As shown, the transceiver 500 includes amplifiers 502 and 504, transformers 510, 520, and 550, capacitive elements $C_{ac}$ and $C_{aux}$, internal TR switches 542 and 544, and LNA 522. In some aspects, the amplifiers 502 and 504 and transformers 510 and 520 may form a series Doherty PA (e.g., the amplifier 502 may be a main amplifier of the series Doherty PA, the transformer 510 may be a main transformer of the series Doherty PA, the amplifier 504 may be an auxiliary amplifier of the series Doherty PA, and the transformer 520 may be an auxiliary transformer of the series Doherty PA). For a receive mode of transceiver 500, the internal TR switches 542 and 544 may each be in an open state. For a transmit mode of transceiver 500, the internal TR switches 542 and 544 may each be in a closed state.

The amplifier 502 has outputs coupled to respective terminals of a primary winding ($L_{pri}$) of the transformer 510, and the amplifier 504 has outputs coupled to respective terminals of a primary winding ($L_{pri}$) of the transformer 520. The secondary winding ($L_{sec}$) of the transformer 520 is coupled between the secondary winding ($L_{sec}$) of the transformer 510 and the internal TR switch 542. The capacitive element $C_{aux}$ is coupled in parallel with the secondary winding ($L_{sec}$) of the transformer 520. The capacitive element $C_{ac}$ is coupled between a terminal of the secondary winding ($L_{sec}$) of the transformer 510 and a terminal of the internal TR switch 544.

The LNA 522 may include transistors $T_1$ and $T_2$ (e.g., n-type metal-oxide-semiconductor (NMOS) transistors). A diode 580 is coupled between the gate and source of the transistor $T_2$. Diode 582 is in series with diode 584, diodes 582 and 584 are coupled in anti-parallel with diode 580, and diodes 582 and 584 are coupled between the gate and source of the transistor $T_2$. The transformer 550 may be implemented as a two-winding transformer with a primary winding ($L_g$) and a secondary winding ($L_{gnd}$+$L_{src}$). A tap (e.g., center tap) of the transformer 550 may be coupled to a reference potential node (e.g., electrical ground) and may separate the secondary winding into two sub-windings (e.g., $L_{gnd}$ and $L_{src}$). The primary winding ($L_g$) of the transformer 550 is coupled between the secondary winding of the transformer 510 and the gate of transistor $T_2$ of LNA 522, and the secondary winding ($L_{gnd}$) of the transformer 550 is coupled between the secondary winding of the transformer 520 and source of transistor $T_2$ of LNA 522.

In the depicted architecture of transceiver 500, a first (parallel) path 530 from the RFIO pin 506 to the input of the LNA 522 (via gate of transistor $T_2$) may include the capacitive element $C_{ac}$ and primary inductance ($L_g$) of the transformer 550. A second (series) path 540 from the RFIO pin 506 to the input of the LNA 522 (via transformers 510, 520 and 550) may include the secondary winding ($L_{sec}$) of the transformer 510, the secondary winding ($L_{sec}$) of the transformer 520 in parallel with the capacitive element $C_{aux}$, and the secondary winding ($L_{gnd}$) of the transformer 550. The values of the capacitive elements $C_{ac}$ and $C_{aux}$ may be determined by the desired (or target) phase shift between the amplifiers 502 and 504 for Doherty operation.

Note, the internal TR switches 542 and 544 may be implemented by a transmission gate or any of other various suitable components, such as a field-effect transistor (FET) (with a p-type metal-oxide-semiconductor (PMOS) implementation or NMOS implementation), negative-positive-negative (NPN) transistor, or positive-negative-positive (PNP) transistor, as illustrative, non-limiting examples. In certain cases, the internal TR switches 542 and 544 may be configured to be in a closed state or open state in response to receiving a control signal from a controller, such as controller 336. Note that while FIG. 5 depicts the transformer 550 being implemented as a two-winding transformer, other configurations of the transformer 550 consistent with the functionality described herein may be used. For example, in certain aspects, the transformer 550 may be implemented as a three-winding transformer.

One potential challenge with implementing concurrent matching with the architecture of transceiver 500 is that it can result in loss in one or more passive devices (e.g., transformer 510 and 520) of the transceiver 500, as well as introduce a NF peak close to the in-band frequency of the receive mode, thereby degrading the RxNF. For example, the 'ON' resistance of the internal TR switch 542 may introduce a loss for the transformer 520, reducing the efficiency and output power of the transmit mode for transceiver 500. Additionally, (i) the resonance due to part of capacitive element $C_{aux}$ and inductance of the transformer 510 plus inductance $L_{gnd}$ of transformer 550 and (ii) the resonance in the second (series) path due to the inductance of the transformer 520 in parallel with the capacitive element $C_{aux}$, may create NF peaks close to the in-band frequency for the first path and second path, respectively, in the receive mode of the transceiver 500, degrading the RxNF.

Further, in the architecture of the transceiver 500, there may be a significant conflict/tradeoff between the transmit and receive performance metrics of the transceiver 500 with respect to the values of the capacitance elements $C_{ac}$ and $C_{aux}$. For example, larger values for the capacitive elements $C_{ac}$ and $C_{aux}$ may lead to better receive performance metrics in terms of improved RxNF, but may lead to lower transmit performance metrics in terms of lower output power and lower transmit efficiency. On the other hand, lower values for the capacitive elements $C_{ac}$ and $C_{aux}$ may lead to lower receive performance metrics in terms of lower RxNF, but may lead to better transmit performance metrics in terms of higher output power and higher transmit efficiency.

Accordingly, aspects described herein provide improved techniques and apparatus for implementing concurrent matching for a transceiver implemented with one or more internal TR switches and a series Doherty PA.

Figure 6:
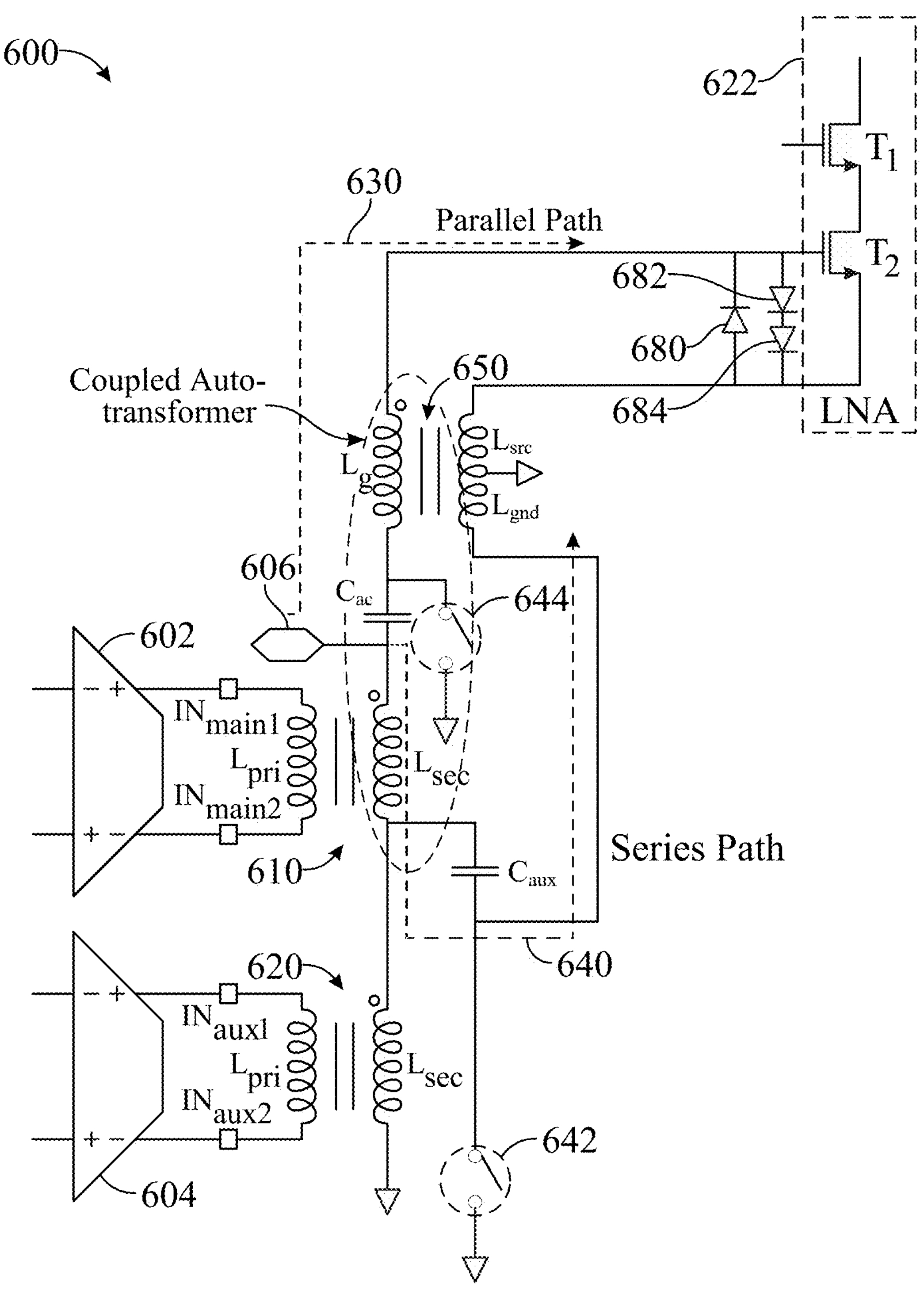

FIG. 6 illustrates an example transceiver 600, in accordance with certain aspects of the present disclosure. The transceiver 600 may represent a portion of a transceiver circuit, such as the RF transceiver circuit 300 of FIG. 3, implemented with a single RFIO pin 606, a series Doherty PA (including amplifier 602 and amplifier 604), and internal TR switches 642 and 644.

As shown, the transceiver 600 includes amplifiers 602 and 604, transformers 610, 620, and 650, capacitive elements $C_{ac}$ and $C_{aux}$, internal TR switches 642 and 644, and LNA 622. In certain aspects, the amplifiers 602 and 604 and transformers 610 and 620 may form a series Doherty PA (e.g., the amplifier 602 may be a main amplifier of the series Doherty PA, the transformer 610 may be a main transformer of the series Doherty PA, the amplifier 604 may be an auxiliary amplifier of the series Doherty PA, and the transformer 620 may be an auxiliary transformer of the series Doherty PA). For a receive mode of transceiver 600, the internal TR switches 642 and 644 may each be in an open state. For a transmit mode of transceiver 600, the internal TR switches 642 and 644 may each be in a closed state.

The transformer 610 has a first input ($IN_{main1}$) and a second input ($IN_{main2}$) coupled to a first output and a second output of the amplifier 602, respectively. A primary winding ($L_{pri}$) of the transformer 610 is coupled between the first input ($IN_{main1}$) and the second input ($IN_{main2}$) of the transformer 610. The transformer 610 also includes a secondary winding ($L_{sec}$) inductively coupled to the primary winding ($L_{pri}$) of the transformer 610.

The transformer 620 has a first input ($IN_{aux1}$) and a second input ($IN_{aux2}$) coupled to a first output and a second output of the amplifier 604, respectively. A primary winding ($L_{pri}$) of the transformer 620 is coupled between the first input ($IN_{aux1}$) and the second input ($IN_{aux2}$) of the transformer 620. The transformer 620 also includes a secondary winding ($L_{sec}$) inductively coupled to the primary winding ($L_{pri}$) of the transformer 620 and coupled between a second terminal of the secondary winding ($L_{sec}$) of the transformer 610 and a reference potential node (e.g., electrical ground).

The internal TR switch 642 is coupled between the first terminal of the secondary winding ($L_{sec}$) of the transformer 650 and the reference potential node. The capacitive element $C_{aux}$ is coupled between the second terminal of the secondary winding ($L_{sec}$) of the transformer 610 and the internal TR switch 642.

The LNA 622 may include transistors $T_1$ and $T_2$ (e.g., n-type metal-oxide-semiconductor (NMOS) transistors). A diode 680 is coupled between the gate and source of the transistor $T_2$. Diode 682 is in series with diode 684, diodes 682 and 684 are coupled in anti-parallel with diode 680, and diodes 682 and 684 are coupled between the gate and source of the transistor $T_2$. The transformer 650 may be implemented as a two-winding transformer with a primary winding ($L_g$) and a secondary winding ($L_{gnd}$+$L_{src}$). A tap (e.g., center tap) of the transformer 650 may be coupled to a reference potential node (e.g., electrical ground) and may separate the secondary winding into two sub-windings (e.g., $L_{gnd}$ and $L_{src}$). The primary winding ($L_g$) of the transformer 650 is coupled between the $C_{ac}$ and the gate of transistor $T_2$ of LNA 522. The secondary winding ($L_{gnd}$+$L_{src}$) of the transformer 650 is inductively coupled to the primary winding ($L_g$) of the transformer 650 and coupled between the internal TR switch 642 and source of transistor $T_2$ of LNA 622.

The capacitive element $C_{ac}$ is coupled between the first terminal of the secondary winding ($L_{sec}$) of the transformer 610 and the primary winding ($L_g$) of the transformer 650. The internal TR switch 644 is coupled between the capacitive element $C_{ac}$ and the reference potential node.

In the depicted architecture of transceiver 600, a first (parallel) path 630 from the RFIO pin 606 to the LNA 622 (e.g., gate of transistor $T_2$ of LNA 622) may include the capacitive element $C_{ac}$ and primary winding ($L_g$) of the transformer 650. A second (series) path 640 from the RFIO pin 606 to the LNA 622 (e.g., gate of transistor $T_2$ of LNA 622) may include the secondary winding ($L_{sec}$) of the transformer 610, the capacitive element $C_{aux}$, the secondary winding ($L_{gnd}$) of the transformer 650 and inductive coupling between $L_{gnd}$ and $L_g$ of transformer 650.

Note, the internal TR switches 642 and 644 may be implemented by a transmission gate or any of other various suitable components, such as a FET (with a PMOS implementation or NMOS implementation), NPN transistor, or PNP transistor, as illustrative, non-limiting examples. In certain cases, the internal TR switches 642 and 644 may be configured to be in a closed state or open state in response to receiving a control signal from a controller, such as controller 336. Note that while FIG. 6 depicts the transformer 650 being implemented as a two-winding transformer, other configurations of the transformer 650 consistent with the functionality described herein may be used. For example, in certain aspects, the transformer 650 may be implemented as a three-winding transformer.

In some aspects, the secondary winding ($L_{sec}$) of the transformer 610 and the primary winding ($L_g$) of the transformer 650 may form or compose a coupled auto-transformer, resulting in a step-up transformer with voltage gain prior to the loss from transformer 650, thereby improving the RxNF and the RxFE gain.

Compared to the transceiver 500, the transceiver 600 lacks an internal TR switch coupled to the secondary winding of the auxiliary transformer (e.g., transformer 620) and includes an internal TR switch (e.g., internal TR switch 642) between the capacitive element $C_{aux}$ and the reference potential node. By coupling secondary winding ($L_{sec}$) of the auxiliary transformer directly to the reference potential node without a switch in between, the transmit efficiency and output power of the transmit mode for the transceiver 600 can be improved, relative to transceiver 500. In addition, the transceiver 600 may have better electrostatic discharge (ESD) performance compared to the transceiver 500 since the RFIO pin 606 is shorted to ground (e.g., reference potential node) through the transformers 610 and 620 without any active devices in the ESD discharge path.

In some aspects, compared to the transceiver 500, the parallel resonance of the capacitive element $C_{aux}$ and the secondary winding of the auxiliary transformer is removed from the second (series) path 640. By removing this parallel resonance from the second (series) path 640, the Rx NF peak frequency can be reduced, thereby improving the in-band NF.

In some aspects, compared to transceiver 500, the transceiver 600 may be relatively insensitive to values for the capacitive elements $C_{aux}$ and $C_{ac}$. That is, compared to transceiver 500, there may be a less significant conflict/tradeoff between the transmit and receive performance metrics of the transceiver 600 with respect to the values of the capacitive elements $C_{ac}$ and $C_{aux}$. For example, compared to the transceiver 500, the transceiver 600 may tolerate lower values for the capacitive elements $C_{aux}$ and $C_{ac}$ due to the Lower NF peak frequency that provide improved receive performance metrics and improved transmit performance metrics.

Figure 7:
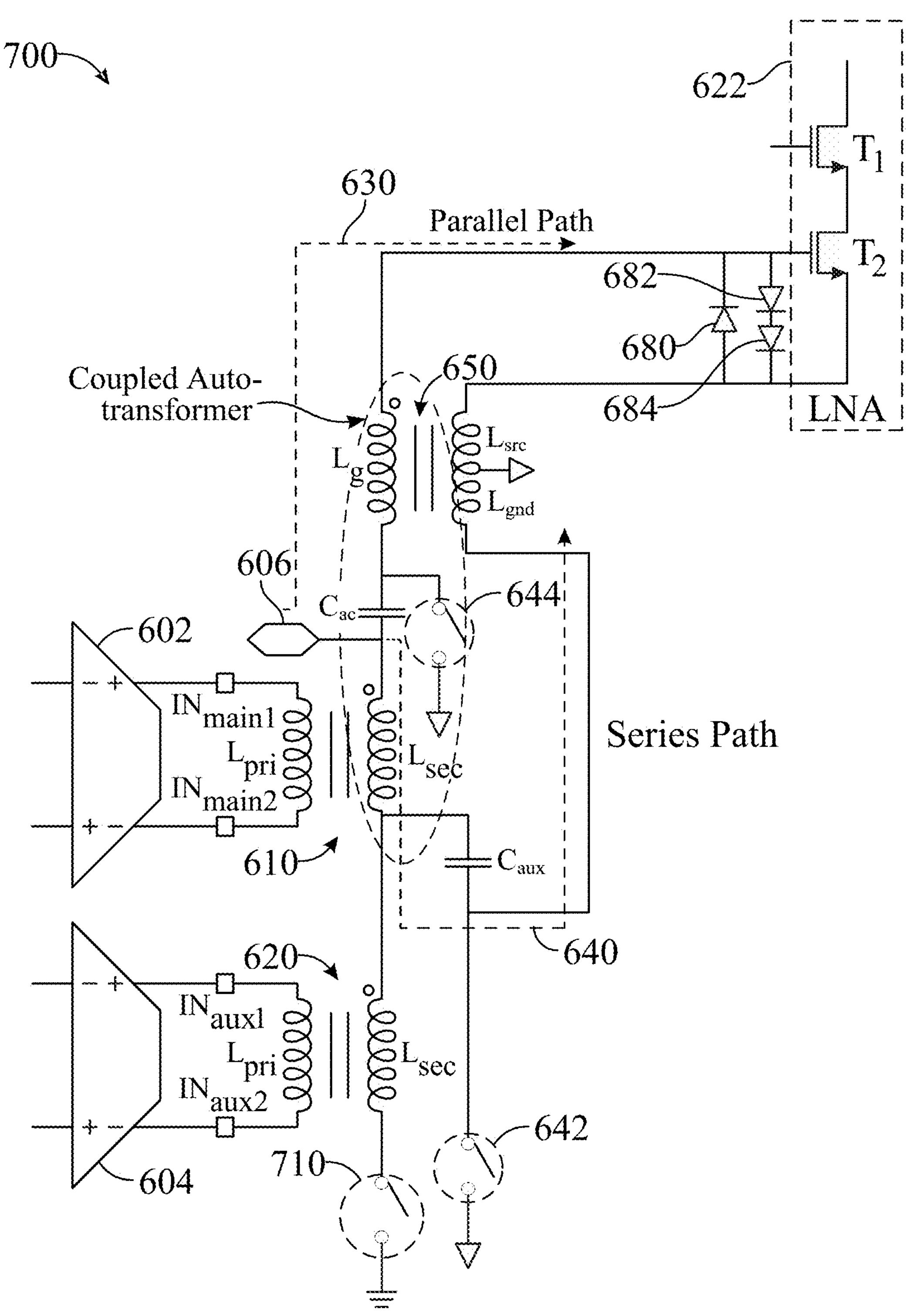

FIG. 7 illustrates an example transceiver 700, in accordance with certain aspects of the present disclosure. The transceiver 700 may represent a portion of a transceiver circuit, such as the RF transceiver circuit 300 of FIG. 3, implemented with a single RFIO pin 606, a series Doherty PA (including amplifier 602 and amplifier 604), and integrated TR switches 642, 644, and 710. Compared to transceiver 600, the transceiver 700 includes an additional internal TR switch 710 coupled between the secondary winding ($L_{sec}$) of the transformer 620 and the reference potential node. For a receive mode of transceiver 700, the internal TR switches 642, 644, and 710 may each be in an open state. For a transmit mode of transceiver 700, the internal TR switches 642, 644, and 710 may each be in a closed state.

Note, the internal TR switches 642, 644, and 710 may be implemented by a transmission gate or any of other various suitable components, such as a FET (with a PMOS implementation or NMOS implementation), NPN transistor, or PNP transistor, as illustrative, non-limiting examples. In certain cases, the internal TR switches 642, 644, and 710 may be configured to be in a closed state or open state in response to receiving a control signal from a controller, such as controller 336.

In some aspects, the parallel resonance of the capacitive element $C_{aux}$ and the secondary winding ($L_{sec}$) of the auxiliary transformer is removed from the second (series) path 640. Additionally, in some aspects, compared to transceiver 600, in transceiver 700, the resonance in the first (parallel) path 630 due to the secondary winding ($L_{sec}$) of the transformer 610, the capacitance element $C_{aux}$ and the secondary winding ($L_{gnd}$) of the transformer 650 may reduce the NF peak frequency further compared to 600 due to disconnecting the secondary winding ($L_{sec}$) of the transformer 620 from the reference node (e.g. ground), improving the RxNF. Note, in some cases, the loss introduced by the internal TR switch 710 may lead to the transceiver 700 having less transmit efficiency than transceiver 600, but still greater than transceiver 500. Additionally, the transceiver 700 may be relatively insensitive to values for the capacitive elements $C_{aux}$ and $C_{ac}$ due to the lower NF peak frequency. That is, compared to transceiver 500 and 600, there may be a less significant conflict/tradeoff between the transmit and receive performance metrics of the transceiver 600 with respect to the values of the capacitive elements $C_{ac}$ and $C_{aux}$.

FIG. 8 is a flow diagram illustrating example operations 800 for wireless communication, in accordance with certain aspects of the present disclosure. The operations 800 may be performed, for example, by a transceiver, such as the transceiver 600 or transceiver 700.

At block 802, during a transmit mode, the transceiver may couple an output from at least one of a first amplifier (e.g., amplifier 602) or a second amplifier (e.g., amplifier 604) to an RFIO pin (e.g., RFIO pin 606).

At block 804, during a receive mode, the transceiver may couple an input from the RFIO pin to a third amplifier (e.g., LNA 622) via at least one of a first path (e.g., first (parallel) path 630) or a second path (e.g., second (series) path 640) within the transceiver.

The transceiver may include a first transformer (e.g., transformer 610) including: (i) a first input ($IN_{main1}$) and a second input ($IN_{main2}$) coupled to a first output and a second output of the first amplifier; (ii) a primary winding ($L_{pri}$) coupled between the first input and the second input of the first transformer; and (iii) a secondary winding ($L_{sec}$) inductively coupled to the primary winding of the first transformer. The transceiver may also include a second transformer (e.g., transformer 620) including: (i) a first input ($IN_{aux1}$) and a second input ($IN_{aux2}$) coupled to a first output and a second output of the second amplifier; (ii) a primary winding ($L_{pri}$) coupled between the first input and the second input of the second transformer; and (iii) a secondary winding ($L_{sec}$) inductively coupled to the primary winding and coupled between a second terminal of the secondary winding of the first transformer and a reference potential node (e.g., electrical ground).

The transceiver may further include a capacitive element (e.g., $C_{ac}$) coupled between the first terminal of the secondary winding of the first transformer (e.g., transformer 610) and the primary winding of a third transformer (e.g., transformer 650) of the transceiver, and a capacitive element (e.g., $C_{aux}$) coupled between the second terminal of the secondary winding of the first transformer (e.g., transformer 610) and the secondary winding of the third transformer (e.g., transformer 650). The transceiver may further include a first switch (e.g., internal TR switch 642) coupled between the capacitive element ($C_{aux}$) and the reference potential node, and a second switch (e.g., internal TR switch 644) coupled between the capacitive element ($C_{ac}$) and the reference potential node. The third transformer (e.g., transformer 650) may include a primary winding ($L_g$) coupled between the capacitive element (Cac) and a first input (e.g., gate of transistor $T_2$ of LNA 622) of the third amplifier, and a secondary winding ($L_{gnd}$+$L_s$) coupled between the capacitive element ($C_{aux}$) and a second input (e.g., source of transistor $T_2$ of LNA 622).

Example Aspects

In addition to the various aspects described above, specific combinations of aspects are within the scope of the present disclosure, some of which are detailed below:

Aspect 1: A transceiver comprising: a first amplifier; a second amplifier; a third amplifier; a first transformer comprising: a first input and a second input coupled to a first output and a second output of the first amplifier; a primary winding coupled between the first input and the second input of the first transformer; and a secondary winding inductively coupled to the primary winding of the first transformer; a second transformer comprising: a first input and a second input coupled to a first output and a second output of the second amplifier; a primary winding coupled between the first input and the second input of the second transformer; and a secondary winding inductively coupled to the primary winding and coupled between a first terminal of the secondary winding of the first transformer and a reference potential node; a first switch coupled between the first terminal of the secondary winding of the first transformer and the reference potential node; and a third transformer comprising a primary winding coupled between a second terminal of the secondary winding of the first transformer and a first input of the third amplifier.

Aspect 2: The transceiver of Aspect 1, further comprising a second switch coupled between the second terminal of the secondary winding of the first transformer and the reference potential node.

Aspect 3: The transceiver according to any of Aspects 1-2, further comprising a capacitive element coupled between the second terminal of the secondary winding of the first transformer and the primary winding of the third transformer.

Aspect 4: The transceiver of Aspect 3, wherein: a first terminal of the second switch is coupled between the capacitive element and the primary winding of the third transformer; and a second terminal of the second switch is coupled to the reference potential node.

Aspect 5: The transceiver according to any of Aspects 2-4, wherein: for a receive mode of the transceiver, each of the first switch and the second switch is configured to be in an open state; and for a transmit mode of the transceiver, each of the first switch and the second switch is configured to be in a closed state.

Aspect 6: The transceiver according to any of Aspects 2-4, further comprising a third switch coupled between the secondary winding of the second transformer and the reference potential node.

Aspect 7: The transceiver of Aspect 6, wherein: for a receive mode of the transceiver, each of the first switch, the second switch, and the third switch is configured to be in an open state; and for a transmit mode of the transceiver, each of the first switch, the second switch, and the third switch is configured to be in a closed state.

Aspect 8: The transceiver according to any of Aspects 1-7, further comprising a capacitive element coupled between the first terminal of the secondary winding of the first transformer and the first switch.

Aspect 9: The transceiver according to any of Aspects 1-8, wherein the third transformer further comprises a secondary winding inductively coupled to the primary winding of the third transformer and coupled between a second input of the third amplifier and the first switch.

Aspect 10: The transceiver according to any of Aspects 1-9, wherein the secondary winding of the first transformer is inductively coupled to the primary winding of the third transformer, the secondary winding of the first transformer and the primary winding of the third transformer forming a step-up transformer.

Aspect 11: The transceiver according to any of Aspects 1-10, wherein the first amplifier is a main amplifier of a Doherty amplifier and wherein the second amplifier is an auxiliary amplifier of the Doherty amplifier.

Aspect 12: The transceiver according to any of Aspects 1-11, wherein the third amplifier comprises a low-noise amplifier (LNA).

Aspect 13: A wireless device, comprising: an antenna; and a transceiver coupled to the antenna, the transceiver comprising: a first amplifier; a second amplifier; a third amplifier; a first transformer comprising: a first input and a second input coupled to a first output and a second output of the first amplifier; a primary winding coupled between the first input and the second input of the first transformer; and a secondary winding inductively coupled to the primary winding of the first transformer; a second transformer comprising: a first input and a second input coupled to a first output and a second output of the second amplifier; a primary winding coupled between the first input and the second input of the second transformer; and a secondary winding inductively coupled to the primary winding and coupled between a first terminal of the secondary winding of the first transformer and a reference potential node; a first switch coupled between the first terminal of the secondary winding of the first transformer and the reference potential node; and a third transformer comprising a primary winding coupled between a second terminal of the secondary winding of the first transformer and a first input of the third amplifier.

Aspect 14: The wireless device of Aspect 13, wherein the transceiver further comprises a second switch coupled between the second terminal of the secondary winding of the first transformer and the reference potential node.

Aspect 15: The wireless device according to any of Aspects 13-14, wherein the transceiver further comprises a capacitive element coupled between the second terminal of the secondary winding of the first transformer and the primary winding of the third transformer.

Aspect 16: The wireless device according to any of Aspects 13-15, wherein the transceiver further comprises a third switch coupled between the secondary winding of the second transformer and the reference potential node.

Aspect 17: The wireless device according to any of Aspects 13-16, wherein the transceiver further comprises a capacitive element coupled between the first terminal of the secondary winding of the first transformer and the first switch.

Aspect 18: The wireless device according to any of Aspects 13-17, wherein the secondary winding of the first transformer is inductively coupled to the primary winding of the third transformer, the secondary winding of the first transformer and the primary winding of the third transformer forming a step-up transformer.

Aspect 19: The wireless device according to any of Aspects 13-18, wherein the first amplifier is a main amplifier of a Doherty amplifier and wherein the second amplifier is an auxiliary amplifier of the Doherty amplifier.

Aspect 20: A method for wireless communication, comprising: during a transmit mode, coupling an output from at least one of a first amplifier or a second amplifier to a radio frequency (RF) input/output (I/O) (RFIO) pin within a transceiver; and during a receive mode, coupling an input from the RFIO pin to a third amplifier within the transceiver via at least one of a first path or a second path within the transceiver, wherein the transceiver comprises: the first amplifier; the second amplifier; the third amplifier; a first transformer comprising: a first input and a second input coupled to a first output and a second output of the first amplifier; a primary winding coupled between the first input and the second input of the first transformer; and a secondary winding inductively coupled to the primary winding of the first transformer; a second transformer comprising: a first input and a second input coupled to a first output and a second output of the second amplifier; a primary winding coupled between the first input and the second input of the second transformer; and a secondary winding inductively coupled to the primary winding and coupled between a first terminal of the secondary winding of the first transformer and a reference potential node; a first switch coupled between the first terminal of the secondary winding of the first transformer and the reference potential node; and a third transformer comprising a primary winding coupled between a second terminal of the secondary winding of the first transformer and a first input of the third amplifier.

The above description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented, or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim.

The various operations of methods described above may be performed by any suitable means capable of performing the corresponding functions. The means may include various hardware and/or software component(s) and/or module (s), including, but not limited to a circuit, an application-specific integrated circuit (ASIC), or processor. Generally, where there are operations illustrated in figures, those operations may have corresponding counterpart means-plus-function components.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. A transceiver comprising:
- a first amplifier;
- a second amplifier;
- a third amplifier;
- a first transformer comprising:
  - a first input and a second input coupled to a first output and a second output of the first amplifier;
  - a primary winding coupled between the first input and the second input of the first transformer; and
  - a secondary winding inductively coupled to the primary winding of the first transformer;
- a second transformer comprising:
  - a first input and a second input coupled to a first output and a second output of the second amplifier;
  - a primary winding coupled between the first input and the second input of the second transformer; and
  - a secondary winding inductively coupled to the primary winding and coupled between a first terminal of the secondary winding of the first transformer and a reference potential node;
- a first switch coupled between the first terminal of the secondary winding of the first transformer and the reference potential node; and
- a third transformer comprising a primary winding coupled between a second terminal of the secondary winding of the first transformer and a first input of the third amplifier.

2. The transceiver of claim 1, further comprising a second switch coupled between the second terminal of the secondary winding of the first transformer and the reference potential node.

3. The transceiver of claim 2, further comprising a capacitive element coupled between the second terminal of the secondary winding of the first transformer and the primary winding of the third transformer.

4. The transceiver of claim 3, wherein:
- a first terminal of the second switch is coupled between the capacitive element and the primary winding of the third transformer; and
- a second terminal of the second switch is coupled to the reference potential node.

5. The transceiver of claim 2, wherein:
- for a receive mode of the transceiver, each of the first switch and the second switch is configured to be in an open state; and
- for a transmit mode of the transceiver, each of the first switch and the second switch is configured to be in a closed state.

6. The transceiver of claim 2, further comprising a third switch coupled between the secondary winding of the second transformer and the reference potential node.

7. The transceiver of claim 6, wherein:
- for a receive mode of the transceiver, each of the first switch, the second switch, and the third switch is configured to be in an open state; and
- for a transmit mode of the transceiver, each of the first switch, the second switch, and the third switch is configured to be in a closed state.

8. The transceiver of claim 1, further comprising a capacitive element coupled between the first terminal of the secondary winding of the first transformer and the first switch.

9. The transceiver of claim 8, wherein the third transformer further comprises a secondary winding inductively coupled to the primary winding of the third transformer and coupled between a second input of the third amplifier and the first switch.

10. The transceiver of claim 1, wherein the secondary winding of the first transformer is inductively coupled to the primary winding of the third transformer, the secondary winding of the first transformer and the primary winding of the third transformer forming a step-up transformer.

11. The transceiver of claim 1, wherein the first amplifier is a main amplifier of a Doherty amplifier and wherein the second amplifier is an auxiliary amplifier of the Doherty amplifier.

12. The transceiver of claim 1, wherein the third amplifier comprises a low-noise amplifier (LNA).

13. A wireless device, comprising:
- an antenna; and
- a transceiver coupled to the antenna, the transceiver comprising:
  - a first amplifier;
  - a second amplifier;
  - a third amplifier;
  - a first transformer comprising:
    - a first input and a second input coupled to a first output and a second output of the first amplifier;
    - a primary winding coupled between the first input and the second input of the first transformer; and
    - a secondary winding inductively coupled to the primary winding of the first transformer;
  - a second transformer comprising:

a first input and a second input coupled to a first output and a second output of the second amplifier;

a primary winding coupled between the first input and the second input of the second transformer; and a secondary winding inductively coupled to the primary winding and coupled between a first terminal of the secondary winding of the first transformer and a reference potential node;

a first switch coupled between the first terminal of the secondary winding of the first transformer and the reference potential node; and a third transformer comprising a primary winding coupled between a second terminal of the secondary winding of the first transformer and a first input of the third amplifier.

14. The wireless device of claim 13, wherein the transceiver further comprises a second switch coupled between the second terminal of the secondary winding of the first transformer and the reference potential node.

15. The wireless device of claim 14, wherein the transceiver further comprises a capacitive element coupled between the second terminal of the secondary winding of the first transformer and the primary winding of the third transformer.

16. The wireless device of claim 14, wherein the transceiver further comprises a third switch coupled between the secondary winding of the second transformer and the reference potential node.

17. The wireless device of claim 13, wherein the transceiver further comprises a capacitive element coupled between the first terminal of the secondary winding of the first transformer and the first switch.

18. The wireless device of claim 13, wherein the secondary winding of the first transformer is inductively coupled to the primary winding of the third transformer, the secondary winding of the first transformer and the primary winding of the third transformer forming a step-up transformer.

19. The wireless device of claim 13, wherein the first amplifier is a main amplifier of a Doherty amplifier and wherein the second amplifier is an auxiliary amplifier of the Doherty amplifier.

20. A method for wireless communication, comprising:

during a transmit mode, coupling an output from at least one of a first amplifier or a second amplifier to a radio frequency (RF) input/output (I/O) (RFIO) pin within a transceiver; and during a receive mode, coupling an input from the RFIO pin to a third amplifier within the transceiver via at least one of a first path or a second path within the transceiver, wherein the transceiver comprises:

the first amplifier;

the second amplifier;

the third amplifier;

a first transformer comprising:

a first input and a second input coupled to a first output and a second output of the first amplifier;

a primary winding coupled between the first input and the second input of the first transformer; and a secondary winding inductively coupled to the primary winding of the first transformer;

a second transformer comprising:

a first input and a second input coupled to a first output and a second output of the second amplifier;

a primary winding coupled between the first input and the second input of the second transformer; and a secondary winding inductively coupled to the primary winding and coupled between a first terminal of the secondary winding of the first transformer and a reference potential node;

a first switch coupled between the first terminal of the secondary winding of the first transformer and the reference potential node; and a third transformer comprising a primary winding coupled between a second terminal of the secondary winding of the first transformer and a first input of the third amplifier.

* * * * *